United States Patent
Lesartre et al.

(10) Patent No.: US 10,735,030 B2
(45) Date of Patent: Aug. 4, 2020

(54) RE-ENCODING DATA ASSOCIATED WITH FAILED MEMORY DEVICES

(71) Applicant: HEWLETT PACKARD ENTERPRISE DEVELOPMENT LP, Houston, TX (US)

(72) Inventors: Gregg B. Lesartre, Fort Collins, CO (US); Harvey Ray, Frederick, CO (US); Kevin L. Miller, Loveland, CO (US); Chris Michael Brueggen, Allen, TX (US); Martin Foltin, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/670,802

(22) Filed: Aug. 7, 2017

(65) Prior Publication Data
US 2019/0044546 A1     Feb. 7, 2019

(51) Int. Cl.
| H03M 13/00 | (2006.01) |
| H03M 13/37 | (2006.01) |
| G06F 11/10 | (2006.01) |
| H03M 13/15 | (2006.01) |
| H03M 13/35 | (2006.01) |

(52) U.S. Cl.
CPC ..... *H03M 13/3776* (2013.01); *G06F 11/1004* (2013.01); *G06F 11/1048* (2013.01); *H03M 13/152* (2013.01); *H03M 13/1515* (2013.01); *H03M 13/353* (2013.01)

(58) Field of Classification Search
None
See application file for complete search history.

(56) References Cited

U.S. PATENT DOCUMENTS

| 8,255,741 B2* | 8/2012 | Cypher ............... G06F 11/1012 714/54 |
| 8,775,865 B2 | 7/2014 | Yang |
| 9,183,078 B1 | 11/2015 | Zhu et al. |
| 9,442,670 B2* | 9/2016 | Kruger ................. G06F 3/0634 |
| 2010/0058151 A1* | 3/2010 | Parker ................. G06F 11/1068 714/785 |
| 2015/0067245 A1* | 3/2015 | Kruger ................. G06F 3/0634 711/103 |
| 2016/0292254 A1* | 10/2016 | Dhuse ............... G06F 17/30336 |
| 2017/0331498 A1* | 11/2017 | Freudenberger ....... G11C 29/52 |
| 2018/0074892 A1* | 3/2018 | Shappir ............... G06F 11/1068 |

OTHER PUBLICATIONS

Tang, H. et al; "A Hybrid Multimode BCH Encoder Architecture for Area Efficient Re-encoding Approach"; http://ieeexplore.ieee.org/document/7169067/; May 24-27, 2015; 4 pages.

* cited by examiner

*Primary Examiner* — Mujtaba M Chaudry
(74) *Attorney, Agent, or Firm* — Park, Vaughan, Fleming & Dowler LLP

(57) ABSTRACT

A technique includes determining that a given memory device of a plurality of memory devices has failed and in response to the determination that the given memory device has failed, re-encoding a data unit associated with the given memory device. The data unit is associated with a payload and a symbol-based error correction code. The re-encoding includes determining a bit-based error correction code for the payload and replacing the data unit in the memory with the payload and the bit-based error correction code.

15 Claims, 7 Drawing Sheets

RE-ENCODING DATA ASSOCIATED WITH FAILED MEMORY DEVICES

BACKGROUND

Semiconductor memory devices typically are used in a computer system for purposes of storing data related to the various operations of the system. The memory device may be packaged as a unit in a semiconductor package to form a "memory chip," and several such chips may be assembled together to form a memory module. In general, for purposes of accessing a particular memory device, control, data and address signals are provided to the external terminals of the device and are generated by a memory controller of the computer system.

Occasionally, when data is read from a computer memory, the data may contain errors. In this manner, some errors may be due to a memory device failure, whereas other errors may be random soft errors occurring with memory devices that have not failed. Regardless of the source of the errors, data may be stored in the computer memory in a form that allows the detection and correction of such errors. In this regard, payload data may be stored with redundancy data (error correction code (ECC), for example), which permits the detection and possible correction of errors associated with the payload data.

DETAILED DESCRIPTION

Figure 1:
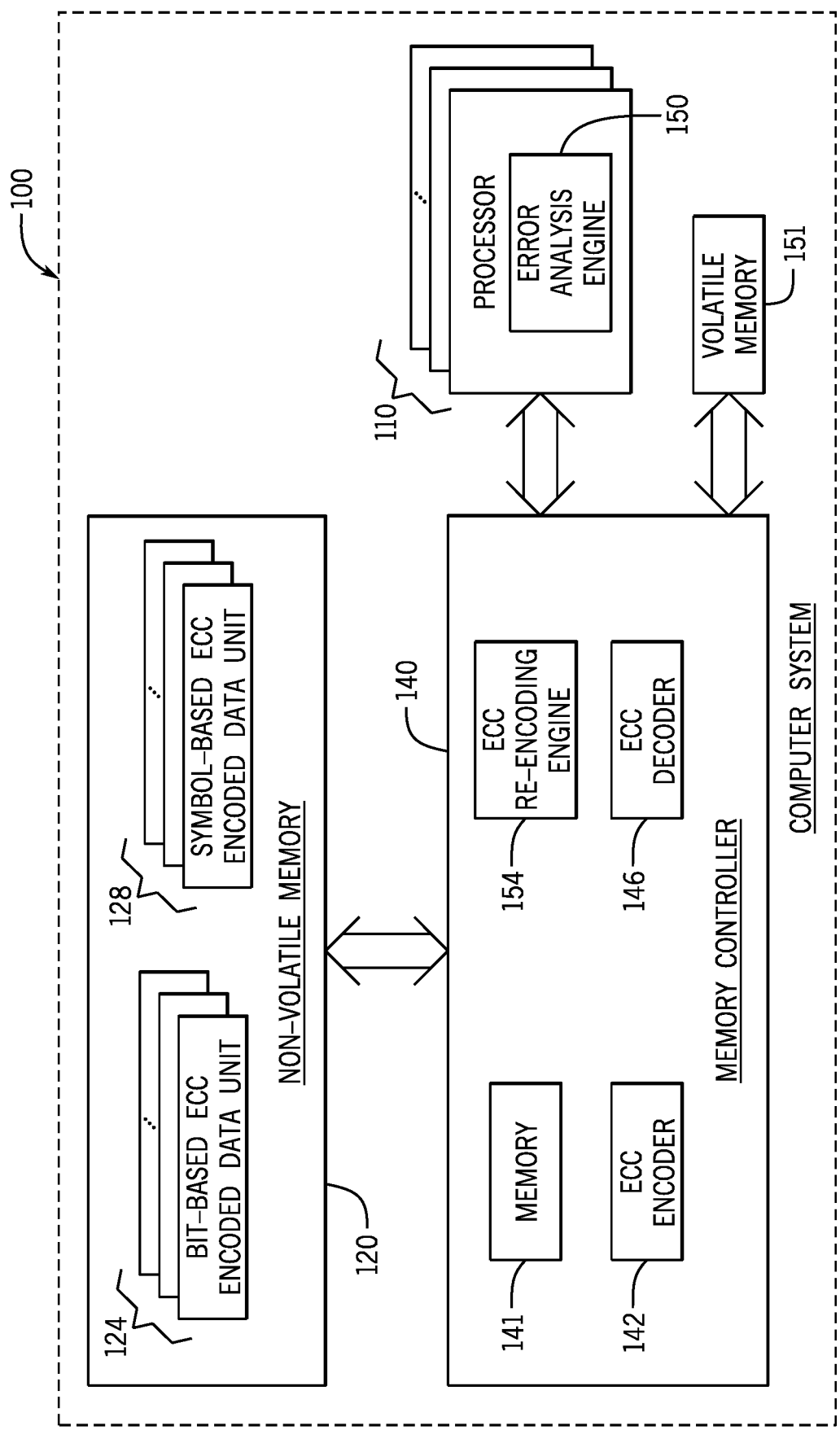
FIG. 1 is a schematic diagram of a computer system according to an example implementation.

Some memories, such as non-volatile memories, employ data redundancy to compensate for a relatively high bit error rate (BER) (the number of bit errors per unit of time). Moreover, the data redundancy allows for the identification of failed memory device. In this context, a "memory device" is a component that contains one or multiple addressable memory locations (one or multiple addressable memory cells, for example) and may include a semiconductor die or a portion thereof. A memory device is considered a "failed" memory device when the performance of the memory device does not meet one or multiple metrics, such as the memory device having a bit error rate (BER) that exceeds a predetermined threshold, an error associated with the memory device exceeding a certain severity level (the number of errant bits surpassing a predetermined threshold, for example), and so forth. Regardless of the metrics that are used, when the computer system deems a memory device to have failed, the computer system may "erase" the memory device. In this context, the erasure of a memory device means that the computer may update a mapping to represent that the memory locations associated with the failed memory device should be ignored.

For purposes of supporting both the correction of errors and the recognition of memory device failure, the computer system may store payload data (the data content and associated metadata, for example) with redundancy data. For example, the computer system may store payload data (also referred to as the "payload" herein) with a symbol-based, error correction code (ECC). In this context, a "symbol-based ECC" refers to an ECC that allows multiple adjacent bits (such as bytes), or symbols, to be recovered in the event that the payload data contains one or multiple errors. In this manner, the payload data and ECC may be stored together as a data unit (a unit of data corresponding to a cache line size, for example) in the memory.

The data unit may be associated with multiple memory devices (called "a rank"). In this manner, when the computer system reads the data unit, the memory devices each provide a corresponding part (eight bytes, for example) of the data unit. When a memory device that is associated with a data unit fails, there is one less memory device available, which thereby reduces the size of the data unit and reduces the number of bytes that may be used for the ECC. For example, each memory device of a rank may provide eight bytes for a data unit corresponding to a cache line, and the failure of one of the memory devices corresponds to a loss of eight bytes for the redundancy data. Moreover, after a device has failed, or multiple devices have failed (if multiple erasures are supported by the computer system), the remaining bytes that are available for redundancy may not be capable of identifying any additional failed memory devices.

As a more specific example, if the data unit is 80 bytes for a full rank of memory devices that each provides eight bytes, then the payload data may have a size of sixty-five bytes, leaving fifteen bytes for the ECC. As an example, a symbol-based ECC, such as a Reed Solomon-based ECC may be used. Failure of a given memory device reduces the size of the data unit by eight bytes (i.e., the size allocated to the erased memory device) and means that the size for the ECC has been reduced from fifteen bytes to seven bytes. For this size of redundancy, a symbol-based ECC code, such as a Reed Solomon code, may be incapable of identifying any additional failed memory devices. Therefore, in accordance with example implementations, the computer re-encodes the data unit by changing the type of the ECC encoding for the data unit from a symbol-based ECC code to a bit-based ECC encoding (a Bose Chaudhuri Hocquenghem (BCH)-ECC, for example). The bit-based ECC encoding, in turn, allows the data unit to benefit from a higher individual bit error correction after the memory device erasure has occurred (as compared to a seven byte symbol-based ECC). As further described herein, in accordance with example implementations, memory regions experiencing erasure may be re-encoded, as well as operate correctly, even during the re-encoding operation.

In accordance with example implementations, every time data is accessed, either by the computer system reading the data, or by a memory module function, such as a function initiated by a scrub engine, a memory controller of the computer system checks the data against the ECC that is stored with the data. An ECC decoder of the memory controller may determine that certain payloads are correct, certain payloads are to be corrected, and certain payloads cannot be corrected. If correctable, the memory controller may correct and return the corrected data to the requesting host; or if accessed by the scrub engine, the memory controller may write the corrected data to the memory. Information may be logged about error corrections, including data that may be used to determine whether memory devices have failed. In this manner, if multiple accesses to memory device indicate a likely memory device failure, the computer system may determine that the memory device has failed and initiate memory device erasure.

In accordance with example implementations, the memory controller may walk the address range of the memory that is impacted by the erasure and re-encode the memory content with bit-based ECC. In this context, "re-encoding" refers to changing the redundancy data. In this manner, the re-encoding may include reading the current content (i.e., payload data and symbol-based ECC code) from the affected addresses (i.e., the addresses of the erased memory device); using the read symbol-based ECC to identify and correct any errors in the payload data; generating bit-based ECC for the payload data; and storing the payload data and bit-based ECC content back in the memory. It is noted that, in accordance with example implementations, the re-encoded ECC and data are stored in a format such that none of the payload or redundancy is contributed by the erased memory device.

In the context of this application, a "failed memory device" refers to a memory device that has entirely or partially failed. The re-encoding therefore may occur for all data units that use a failed memory device, or just the affected portion of data units that use the device.

As described herein, in accordance with example implementations, the re-encoding may share tracking and scheduling resources with other mechanisms that manage data relocation flow, such as mechanisms that involve wear leveling. In this context, "wear leveling" refers to a process in which the computer system regularly relocates or reshuffles memory content to ensure that data use is spread throughout the available address range of the memory so that memory locations that are heavily used, or "hot," do not wear out early.

As a more specific example, FIG. 1 depicts a computer system 100 in accordance with example implementations. For this example implementation, the computer system 100 includes a non-volatile memory 120, which is formed from non-volatile memory devices (memristor or phase change memory devices arranged on memory modules, for example). As depicted in FIG. 1, due to the re-encoding of ECC associated with data units (cache line-sized data units, for example) that have failed, the non-volatile memory 120 contains data units 124 associated with bit-based ECC (i.e., data units associated with an erased memory device) as well as data units 128 in which symbol-based ECC is used (i.e., data units that have not been associated with an erased memory device). As an example, in accordance with some implementations, both the symbol-based ECC encoded data unit 128 and the bit-based ECC encoded data unit 124 encode a sixty-five byte payload (cache line plus metadata). However, the symbol-based ECC data unit 128 includes the symbol-based ECC, which includes fifteen bytes of redundancy (an eighty byte data), and the bit-based ECC data unit 124 includes seven bytes of redundancy (a seventy-two byte data unit).

Access to the non-volatile memory 120 may be controlled by a memory controller 140. In this regard, agents of the computer system 100, such as a scrub engine of the memory controller 140 and one or multiple processors 110 (one or multiple central processing units (CPUs), CPU processing cores, and so forth) may submit memory access requests to the memory controller 140 for purposes of reading data from and writing data to the non-volatile memory 120. The memory controller 140 correspondingly regulates the access to the non-volatile memory 120 by ordering and submitting requests (read and write requests, for example) to the non-volatile memory 120 and providing the results of the requests to the requesting agents.

In accordance with example implementations, the memory controller 140 includes an ECC encoder 142, which is constructed to apply either a bit-based ECC encoding or a symbol-based ECC encoding. In this manner, for purposes of writing a particular data unit to the non-volatile memory 120, which is not associated with any erased memory device, the memory controller 144 uses the ECC encoder 142 to generate symbol-based ECC to form a corresponding symbol-based ECC encoded data unit 128.

When a data unit 124 or 128 is read from the non-volatile memory 120, an ECC decoder 146 of the memory controller 140 identifies the type of ECC encoding (i.e., identifies whether the data unit contains bit-based or symbol-based ECC) for the data unit and applies the appropriate ECC decoding to selectively correct any error(s) in the data that represents the payload. In this context, "selectively correcting" any error(s) in the data representing the payload means that the ECC decoder 146 may or may not correct one or multiple errors. In this manner, the ECC may, in conjunction with examination of the data representing payload, may indicate that no errors exist in the data (and thus, no correction of the data is performed); may indicate that one or multiple errors exist in the data (and thus, correction of the data is performed); or may indicate that, in view of the number or errors, the data cannot be corrected.

In accordance with example implementations, the ECC decoder 146 may identify the type of ECC encoding for a particular data unit by reading data (stored in a memory 141 of the memory controller 140 or other memory) that tracks which memory address chunks (where a "chunk" refers to a block of multiple data units, such as multiple cache lines, for example) are affected by memory device erasure. Additional information stored in the same way indicates which memory device contributing to data in the chunk has been erased. The ECC decoder 146 may combine this information with other information from read data (read from the memory 141 or other memory) that represents whether re-coding has occurred for a given data unit. In this manner, the ECC decoder 146 may determine the encoding of each data unit. If encoded with symbol-based ECC, the ECC decoder 146 may determine which symbols should be ignored. If encoded with bit-based ECC, the ECC encoder 146 may determine the format of the data unit (which avoids storing data in the erased memory device).

The ECC decoder 146 may report any detected errors to an error analysis engine 150 of the computer system 100. The error analysis engine 150, in accordance with example implementations, analyzes the errors to extract metrics that are used to identify memory devices that have failed and correspondingly stores data (such as storing data in the memory 141, for example) to update a mapping to erase these devices.

In accordance with example implementations, one or multiple processors 110 may execute firmware (as part of the Basic Input/Output System (BIOS), for example) for purposes of forming the error analysis engine 150. As an example, this analysis may include determining that a particular memory device has failed based on a number of observed errors associated with the memory device, a bit error rate (BER) for the memory device, a region of memory associated with the memory device, and so forth.

Figure 2:
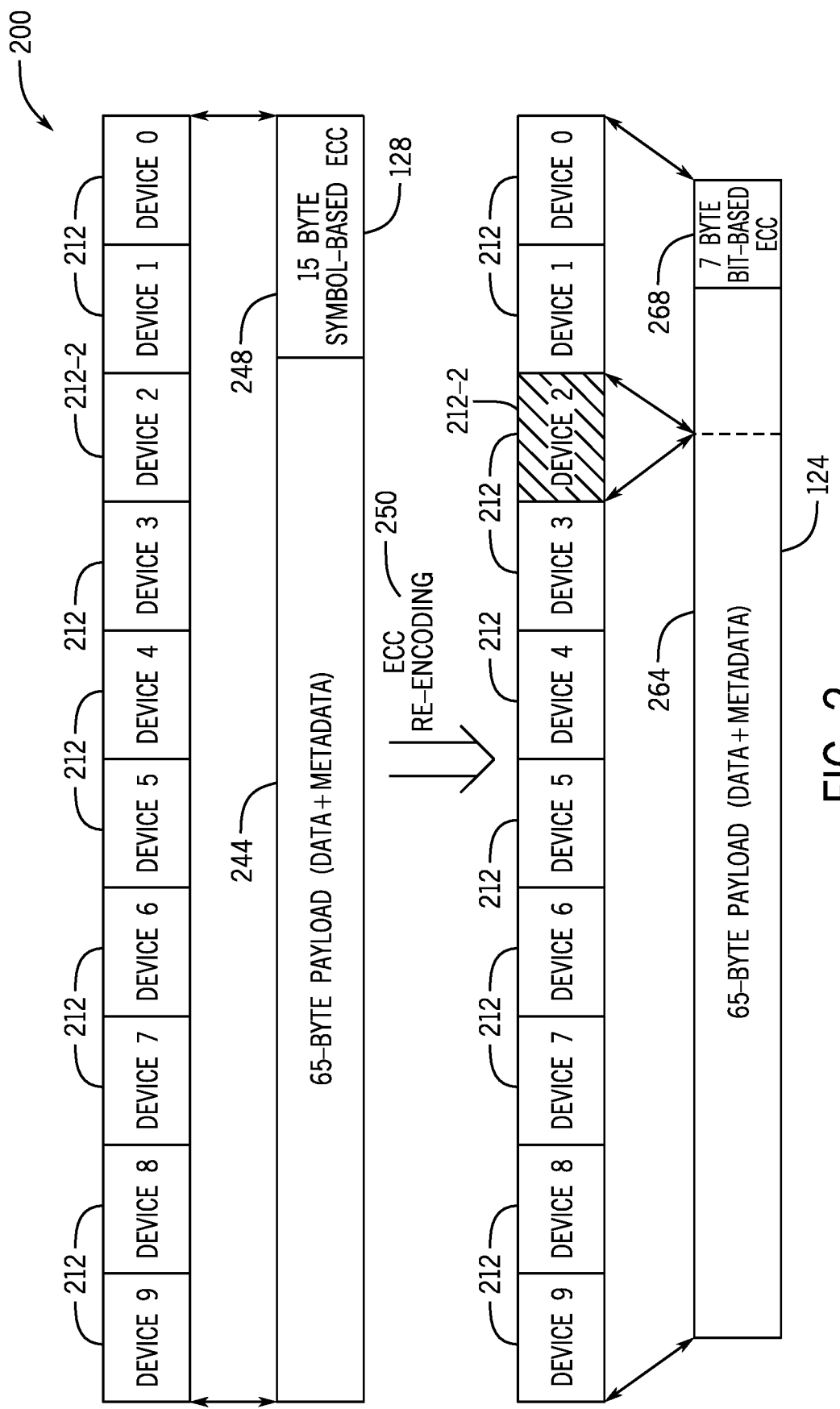
FIG. 2 is an illustration of the re-encoding of data stored in a memory of the computer system of FIG. 1 after a memory device erasure according to an example implementation.

The memory controller 140 includes an ECC re-encoding engine 154 to re-encode data associated with an erased memory device, i.e., transform or convert the affected symbol-based ECC encoded data units 128 (i.e., the data units 128 having associated addresses corresponding to the erased memory device) into bit-based ECC encoded data units 124. FIG. 2 depicts an illustration 200 of the ECC re-encoding process that is performed by the re-encoding engine 154, in accordance with example implementations. Referring to FIG. 2, a particular symbol-based ECC encoded data unit 128 may be formed from data unit parts 212 that are provided by a corresponding full rank of memory devices. For example, as depicted in FIG. 2, the symbol-based ECC encoded data unit 128 is formed from eight byte data unit parts 212, where each eight byte data unit part 212 is provided by a corresponding memory device, and ten memory devices correspondingly collectively provide eighty bytes for the data unit 128. The eighty bytes for the data unit 128 includes sixty-five bytes 244 of payload data (content data and metadata) and fifteen bytes 248 of symbol-based ECC. In accordance with example implementations, metadata may contain information pertaining to a status of the data unit 128 (a progress of a wear leveling operation cycle involving a chunk containing the data unit 128, for example).

For the example that is depicted in FIG. 2, the memory device corresponding to data unit part 212-2 of eight bytes has failed. Therefore, although the memory devices corresponding to the symbol-based ECC encoded data unit 128 collectively provide eighty bytes of data, which includes sixty-five bytes of payload data 244 and fifteen bytes 248 of symbol-based ECC, the memory device failure reduces the data unit size from eighty to seventy-two bytes, as the eight bytes from the failed memory device are ignored, or discarded. In this manner, the ECC re-encoding engine 154 applies an ECC re-encoding 250 to convert, or transform, the eighty byte symbol-based ECC encoded data unit 128 to a corresponding seventy-two byte bit-based ECC encoded data unit 124. For the bit-based ECC encoded data unit 124, data provided by the failed memory device (i.e., the group 212-2 of eight bytes) is omitted. However, the sixty-five byte payload remains. Accordingly, for the bit-based ECC encoded data unit 124, there are seven bytes 268 of bit-based ECC 268 and sixty-five bytes 264 for the payload.

Figure 3:
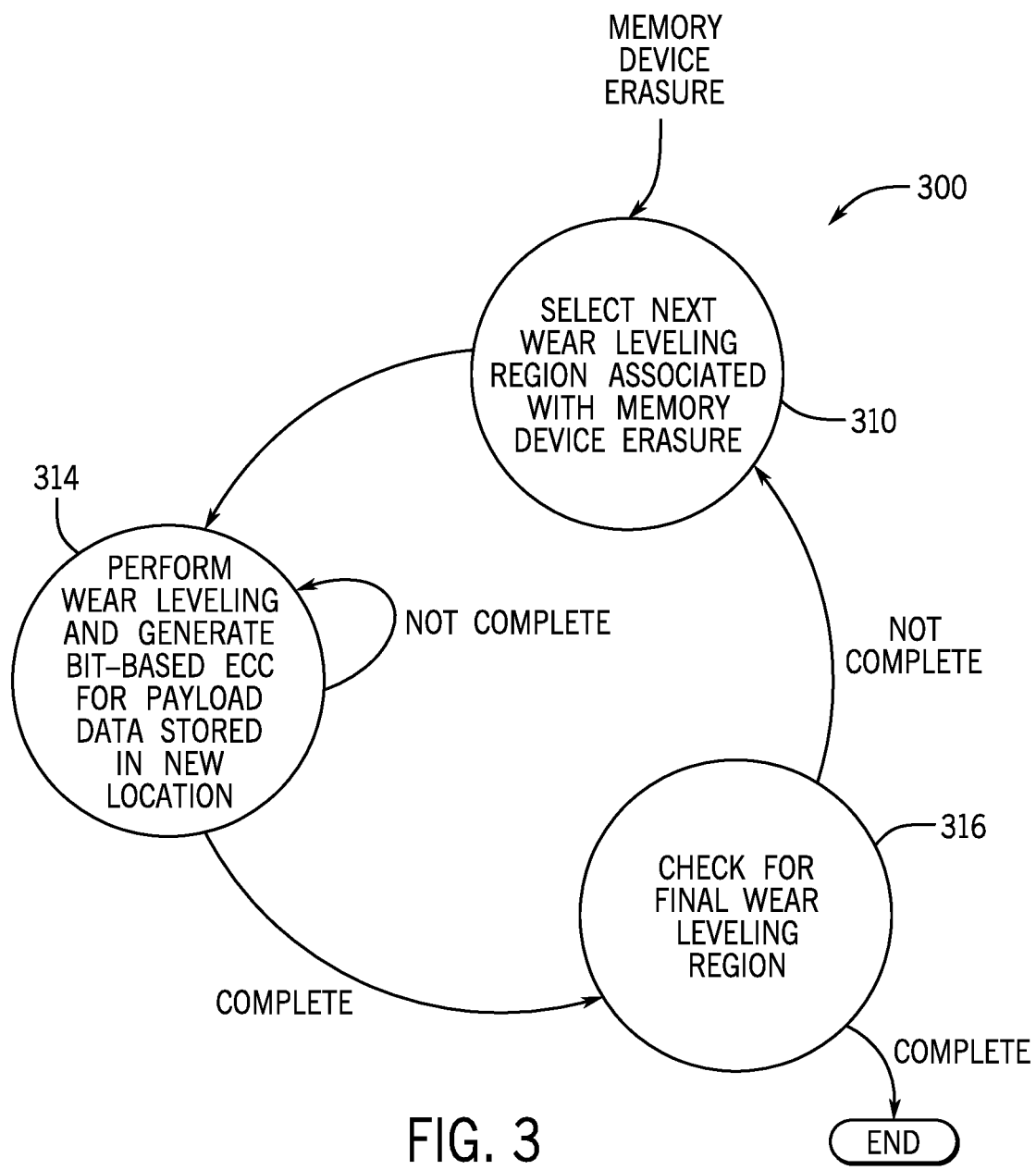
FIG. 3 is a state diagram illustrating operation of an ECC re-encoding engine of a memory controller of the computer system according to an example implementation.

Referring to FIG. 3 in conjunction with FIG. 1, in accordance with example implementations, the memory controller 140 may perform the re-encoding for memory regions that are affected by an erased memory device in conjunction with a wear leveling process. In this manner, "wear leveling" refers to a process in which the memory controller 140 reshuffles, or redistributes, data stored in the non-volatile memory 120 on a regular basis. This redistribution, in turn, is a way in which localized wear is avoided, thereby extending the lifetime of the non-volatile memory 120.

In accordance with example implementations, the memory controller 140 may apply a start gap wear leveling process in which the memory controller 140 redistributes the data units in the non-volatile memory 120 using a "gap" of extra memory. For example, the gap may be created as an extra data unit corresponding to a cache line size. In the start gap wear leveling, the memory controller 140 may shift a group of data units (called a chunk), such that a given data unit of the chunk being relocated is moved into a gap, the next data unit is moved into the gap created by the moving of the first data unit, and so forth. This movement may be controlled by corresponding gap and start pointers.

In accordance with example implementations, the memory controller 140 may perform a wear leveling process that is depicted by corresponding state diagram 300 of FIG. 3. In this manner, the memory controller 140 may enter a first state 310 in response to a particular memory device erasure. In the state 310, the memory controller 140 selects the next wear leveling region to be processed. In this manner, the erasure of a given memory device may affect one or multiple wear leveling regions, and in general, pursuant to the state diagram 300, the memory controller 140 may perform wear leveling for all of the affected regions, in accordance with example implementations.

After selection of the next leveling wear region, the memory controller 140 may transition to another state 314, in which the memory controller 140 performs wear leveling and generates bit-based ECC for the payload data stored in the next wear leveling gap. In this manner, in accordance with some implementations, a wear leveling gap may be an associated data unit that corresponds to a cache line. When the wear leveling is completed for the next wear leveling region, memory controller 140 transitions to a state 316 in which the memory controller 140 checks to see if another wear leveling region exists corresponding to the erased memory device. If so, control transitions back to state 310. Otherwise, the wear leveling corresponding to the erased memory device is complete.

Figure 4:
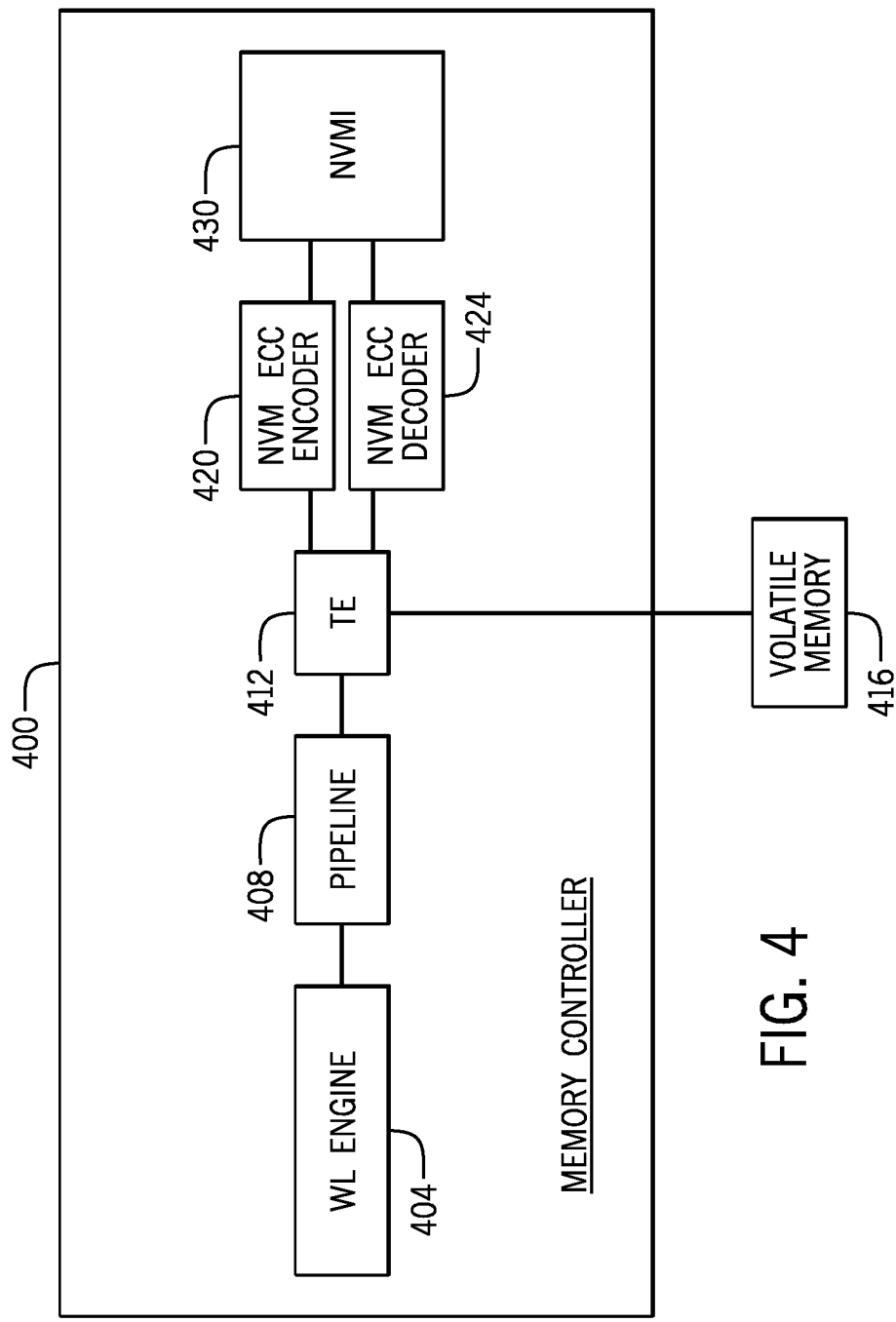
FIG. 4 is a schematic diagram of a memory controller according to a further example implementation.

Referring to FIG. 4, in accordance with some implementations, a memory controller 400 may be used in place of the memory controller 140 of FIG. 1. The memory controller 400 includes a wear leveling engine 404, a pipeline 408; a transaction engine 412; an associated volatile memory 416 associated with the transaction engine 412, which stores data representing wear level processing, as further described herein; a non-volatile memory ECC encoder 420; a non-volatile ECC decoder 424; and a non-volatile memory interface 430.

Figure 5:
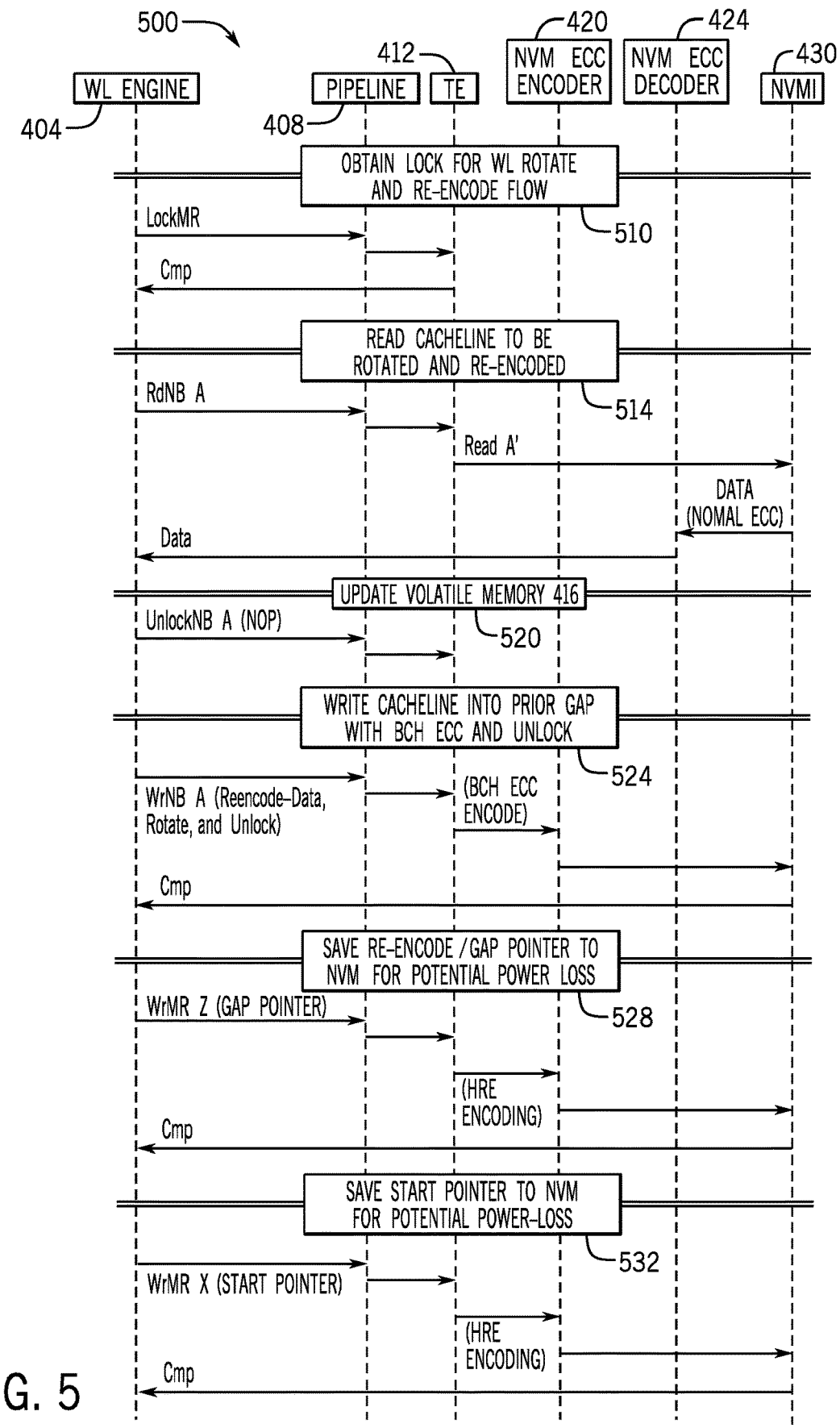
FIG. 5 is an illustration of a communication flow used by the memory controller of FIG. 4 to perform ECC re-encoding in conjunction with a wear leveling operation according to an example implementation.

Referring to FIG. 5 in conjunction with FIG. 4, the components of the memory controller 400 may communicate according to a flow 500, in accordance with example implementations, for purposes of combining wear level processing for a given wear leveling region (a region corresponding to multiple cache lines, for example) and ECC re-encoding. In this manner, referring to FIG. 5, a wear level region engine 404 may first obtain a lock (block 510) for purposes of rotating the wear level region and re-encoding the ECC for the wear level region. As depicted in FIG. 5, this process may include the wear leveling engine 404 submitting a lock request through the pipeline 408, to the transaction engine 412, which secures the lock and indicates completion of the lock. Next, the wear leveling engine 404 initiates a read of a cache line within the wear level region to be rotated and re-encoded, as depicted at reference numeral 514. Thus, the wear leveling engine 404 reads the data unit, which propagates through the pipeline 408 and the transaction engine 412 to form a corresponding transaction to the non-volatile memory interface 430. The non-volatile memory 120 correspondingly furnishes data that is encoded with the symbol-based ECC. The decoder 424 correspondingly decodes the symbol-based ECC, corrects any errors and provides the corresponding cache line back to the wear leveling engine 404. Next, as depicted at reference numeral 520, the wear leveling engine 404 updates the memory 416 to update the corresponding gap and start pointers, as appropriate. Next, as depicted in block 524 the access cache line is re-encoded with a bit based ECC and written into the prior gap, and the data unit address is unlocked. The wear leveling engine 404 then initiates a process, as depicted at block 528, to save the gap pointer to the non-volatile memory 120 for purposes of protecting against unexpected power loss. Next, the wear leveling engine 404 may save (block 532) the start pointer to the non-volatile memory 120 to account for an unexpected power loss.

Figure 6:
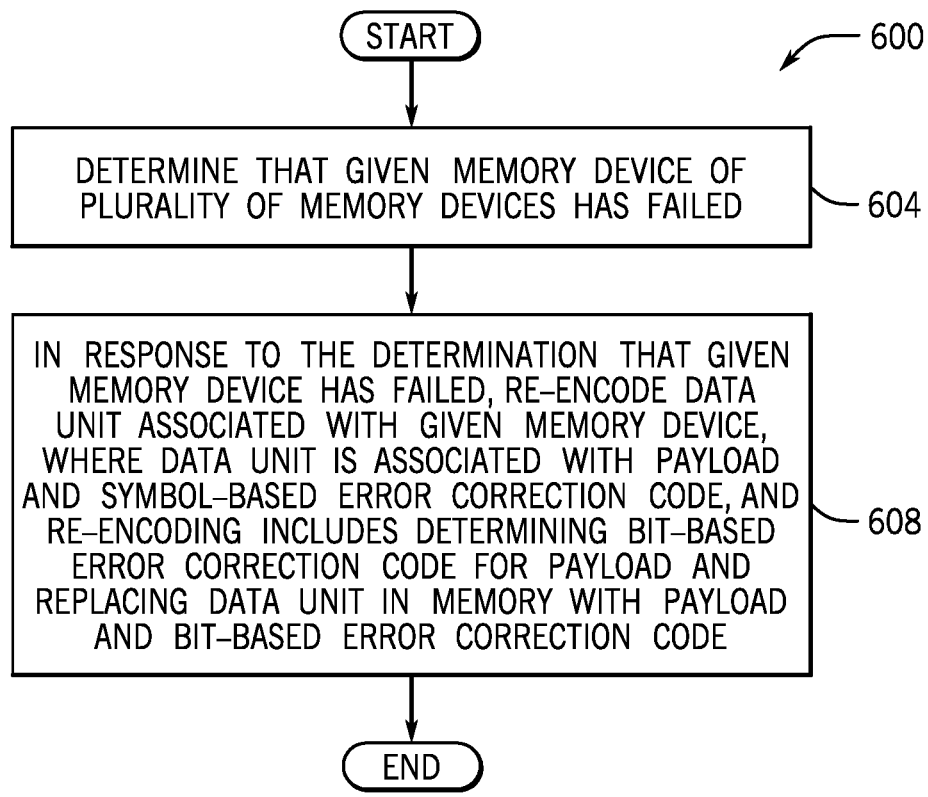
FIG. 6 is a flow diagram depicting a technique to perform ECC re-encoding according to an example implementation.

Referring to FIG. 6, thus, in accordance with example implementations, a technique 600 includes determining (block 604) that a given memory device of a plurality of memory devices has failed. The technique 600 includes, pursuant to block 608, in response to determining that the given memory device has failed, re-encoding a data unit associated with the given memory device. The data unit is associated with a payload and symbol-based error correction code, and the re-encoding includes determining bit-based error correction code for the payload and replacing the data unit in memory with the payload and bit-based error correction code.

Figure 7:
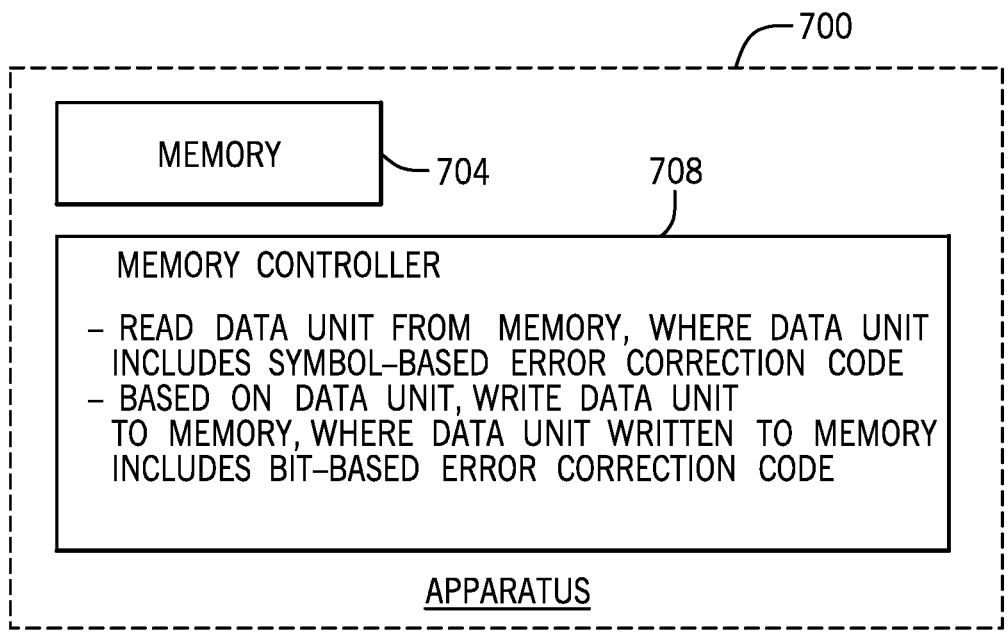
FIGS. 7 and 8 are schematic diagrams depicting apparatuses to perform ECC re-encoding according to example implementations.
Figure 8:
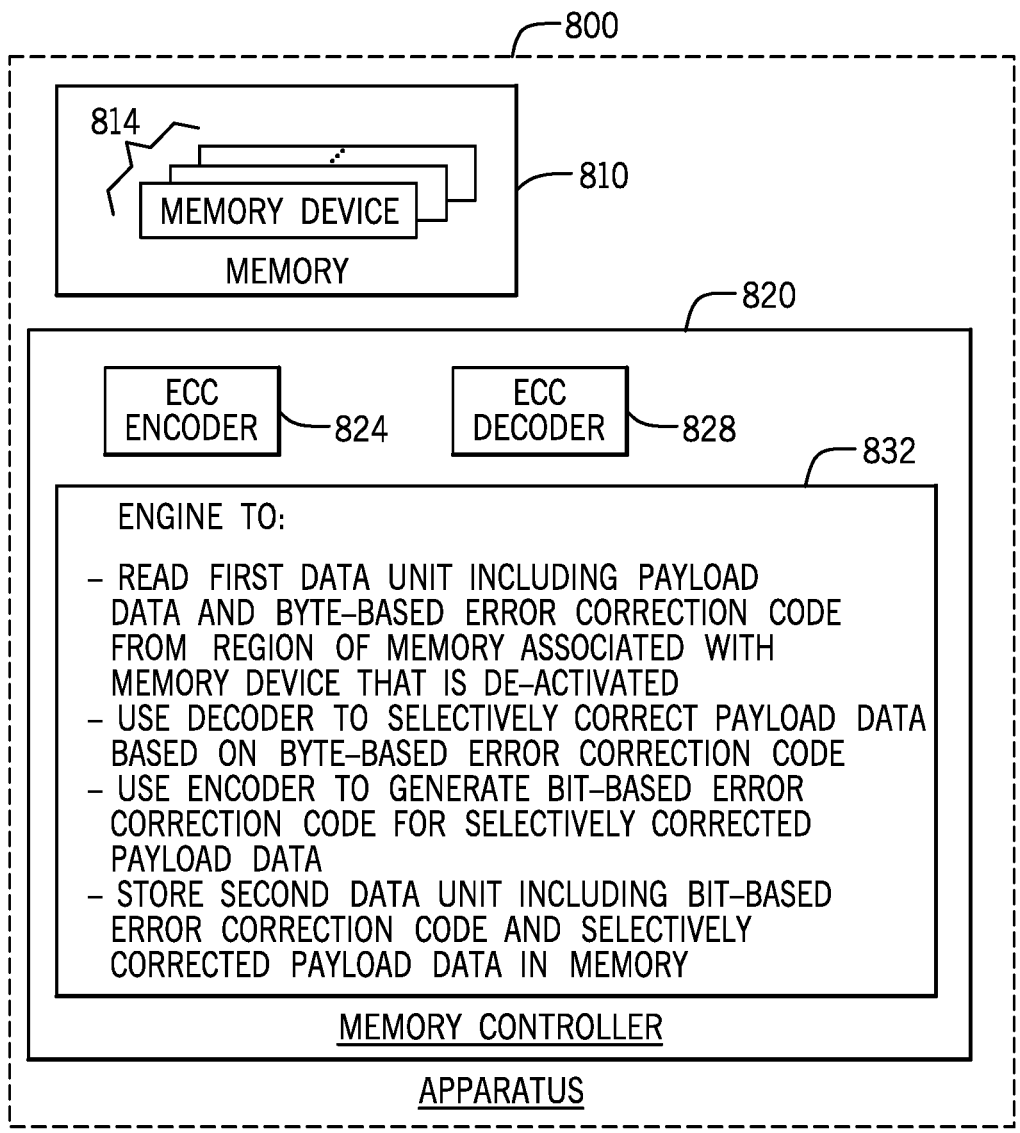

More specifically, referring to FIG. 7, in accordance with example implementations, an apparatus 700 includes a memory 704 and a memory controller 708. The memory controller 708 reads a data unit from the memory 704, where the data unit includes symbol-based error correction code. Based on the data unit, the memory controller 708 writes a data unit to the memory 704, where the data written to the memory 704 includes bit-based error correction code.

In accordance with example implementations, an apparatus 800 includes a memory 810 that includes a plurality of memory devices 814, including a memory device 814 that is de-activated. The apparatus 800 includes a memory controller 820, which includes an error correction code encoder 824, an error correction code decoder 828 and an engine 832. The engine 832 reads first data unit including payload data and byte-based error correction code from a region of the memory 810 that is associated with the memory device 814 that is de-activated; uses the decoder 828 to selectively correct the payload data based on the byte-based error correction code; uses the encoder 824 to generate bit-based error correction code for the selectively-corrected payload data; and stores second data unit including the bit-based error correction code and the selectively corrected payload data in the memory 810.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. A method comprising:
   determining that a given memory device of a plurality of memory devices has failed; and
   in response to the determination of the failed memory device and further in response to identifying a plurality of wear-leveling memory regions associated with the failed memory device:
      reading a first data unit from a respective wear-leveling memory region associated with the failed memory device, the first data unit including a first payload and a symbol-based error correction code;
      correcting an error in the first payload based on the symbol-based error correction code to produce a corrected payload;
      re-encoding the first data unit associated with the failed memory device to a second data unit by determining a bit-based error correction code for the corrected payload; and
      storing the second data unit, the second data unit having a format such that that the second data unit is stored in at least one of the plurality of memory devices but is not stored in the failed memory device.

2. The method of claim 1, further comprising determining that the given memory device has failed based on at least one of the following:
   a number of observed errors associated with the given memory device, a region of the memory associated with the given memory device, or an error rate associated with the given memory device.

3. The method of claim 1, wherein the bit-based error correction code comprises Bose Chaudhuri Hocquenghem (BCH)-based error correction code.

4. The method of claim 1, wherein the symbol-based error correction code comprises Reed Solomon-based error correction code.

5. The method of claim 1, further comprising erasing the failed memory device.

6. An apparatus comprising:
   a memory including a plurality of memory devices; and
   a memory controller to:
      determine that a given memory device of the plurality of memory devices has failed; and
      in response to the determination of the failed memory device and further in response to identifying a plurality of wear-leveling memory regions associated with the failed memory device:
         read a first data unit from a respective wear-leveling memory region associated with the failed memory device, wherein the first data unit comprises a first payload and a symbol-based error correction code;
         correct an error in the first payload based on the symbol-based error correction code to produce a corrected payload;
         re-encode the read first data unit to a second data unit by determining a bit-based error correction code for the corrected payload; and
         write the second data unit to the memory, the second data unit having a format such that the second data unit is written to at least one of the plurality of memory devices but is not written to the failed memory device.

7. The apparatus of claim 6, wherein the memory controller comprises:
   a decoder to selectively correct the error in the first payload of the read first data unit based on the symbol-based error correction code.

8. The apparatus of claim 7, wherein the memory controller comprises:
   an encoder to generate the bit-based error correction code based on the selectively corrected error in the first payload.

9. The apparatus of claim 6, wherein the memory controller updates metadata associated with the read first data unit to represent bit-based error correction code encoding for the second data unit.

10. The apparatus of claim 6, wherein the memory comprises a non-volatile memory.

11. The apparatus of claim 6, wherein the symbol-based error correction code comprises Reed Solomon error correction code.

12. The apparatus of claim 6, wherein the bit-based error correction code comprises Bose Chaudhuri Hocquenghem (BCH).

13. The apparatus of claim 6, wherein the symbol-based error correction code is associated with a larger size than a size of the bit-based error correction code.

14. The apparatus of claim 6, wherein a first subset of the plurality of memory devices is associated with the symbol-based error correction code and a second subset of the plurality of memory devices is associated with the bit-based error correction code.

15. The apparatus of claim 6, wherein the memory controller erases the failed memory device of the memory from which the first data unit is read.

\* \* \* \* \*